(12) United States Patent
Park

(10) Patent No.: US 6,762,105 B2
(45) Date of Patent: Jul. 13, 2004

(54) SHORT CHANNEL TRANSISTOR FABRICATION METHOD FOR SEMICONDUCTOR DEVICE

(75) Inventor: Jeong Ho Park, kyoungki-do (KR)

(73) Assignee: Dongbu ELectronics Co., Ltd., Seoul (KR)

( * ) Notice: Subject to any disclaimer, the term of this patent is extended or adjusted under 35 U.S.C. 154(b) by 30 days.

(21) Appl. No.: 10/323,328

(22) Filed: Dec. 18, 2002

(65) Prior Publication Data

US 2003/0119320 A1 Jun. 26, 2003

(30) Foreign Application Priority Data

Dec. 20, 2001 (KR) .................................. 10-2001-81784

(51) Int. Cl.⁷ .......................................... H01L 21/336
(52) U.S. Cl. ...................... 438/305; 438/307; 438/589; 438/253; 438/284
(58) Field of Search ................................ 438/301, 303, 438/305, 589, 526, 284, 253, 264, 174, 289; 257/408, 339, 404, 344

(56) References Cited

U.S. PATENT DOCUMENTS

| | | | | |
|---|---|---|---|---|
| 4,636,834 A | * | 1/1987 | Shepard ....................... | 257/336 |
| 4,697,198 A | * | 9/1987 | Komori et al. ............... | 257/345 |
| 5,545,579 A | * | 8/1996 | Liang et al. .................. | 438/291 |
| 5,571,357 A | | 11/1996 | Darrieux et al. | |
| 5,571,738 A | | 11/1996 | Krivokapic | |
| 5,766,998 A | * | 6/1998 | Tseng .......................... | 438/291 |
| 5,879,998 A | * | 3/1999 | Krivokapic .................. | 438/300 |
| 5,965,919 A | * | 10/1999 | Yoo .............................. | 257/351 |
| 5,998,288 A | * | 12/1999 | Gardner et al. .............. | 438/589 |
| 6,011,290 A | * | 1/2000 | Gardner et al. .............. | 257/345 |
| 6,025,635 A | * | 2/2000 | Krivokapic .................. | 257/412 |
| 6,087,208 A | * | 7/2000 | Krivokapic et al. ......... | 438/183 |
| 6,169,006 B1 | * | 1/2001 | Gardner et al. .............. | 438/303 |
| 6,204,133 B1 | * | 3/2001 | Yu et al. ...................... | 438/299 |
| 6,214,677 B1 | * | 4/2001 | Lee .............................. | 438/284 |
| 6,348,385 B1 | * | 2/2002 | Cha et al. .................... | 438/287 |
| 6,417,550 B1 | * | 7/2002 | Madurawe et al. .......... | 257/408 |

* cited by examiner

Primary Examiner—Michael Lebentritt
(74) Attorney, Agent, or Firm—Timothy J. Keefer; Seyfarth Shaw LLP

(57) ABSTRACT

The method comprising sequentially forming a first oxide film, a first nitride film, a second oxide film and a second nitride film on a semiconductor substrate; forming a first mask on the second nitride film; etching the second nitride film and the second oxide film forming a first spacer; sequentially forming a gate insulation film and a gate conductor; wet etching the remaining second nitride film, second oxide film, first nitride film and first spacer; performing LDD implantation on the substrate to form an LDD region; forming a second spacer; performing source/drain implantation to form source/drain regions; removing the remaining first oxide film; and forming a salicide region in the gate conductor and the source/drain regions.

7 Claims, 3 Drawing Sheets

SHORT CHANNEL TRANSISTOR FABRICATION METHOD FOR SEMICONDUCTOR DEVICE

BACKGROUND OF THE INVENTION

1. Field of the Invention

The present invention relates to a short channel transistor fabrication method. In particular, the short channel transistor fabrication method of the invention fabricates transistors having short channels to cope with ultra-fineness of semiconductor devices.

2. Description of the Prior Art

FIG. 1 is a sectional view illustrating a transistor fabrication method for a semiconductor device of the prior art.

As shown in FIG. 1, a gate insulation film 2, a polysilicon layer 3a and a hard mask layer 3b are sequentially layered to a certain height on a semiconductor substrate 1 having a field oxide film (not shown).

The hard mask layer 3b is patterned in the form of a gate electrode, and then the polysilicon layer 3a and the buffer gate insulation film 2 are patterned corresponding to the form of the mask layer 3b so as to form gate regions g.

After spacers 4 are formed at both sides of the gate regions g according to a known method, impurities are doped into the semiconductor substrate 1 outside the spacers so as to form source and drain regions 5.

In the conventional transistor fabrication method for a semiconductor device having the above construction, however, it has been difficult to fabricate the short channel transistor. Also, the above fabrication method disadvantageously requires an additional process in order to overcome Short Channel Effect (SCE) and Drain Induced Barrier Lowering (DIBL) of the transistor.

SUMMARY OF THE INVENTION

The present invention has been made to solve the foregoing problems and it is therefore an object of the present invention to provide a short channel transistor fabrication method for a semiconductor device, by which a short channel transistor adequate for an ultrafine device is fabricated via a spacer.

It is another object of the invention to provide a short channel transistor fabrication method for a semiconductor device, in which a Low Doped Drain (LDD) implant region owing to the above spacer can be formed at a distance from a channel region of the transistor so as to reduce SCE and DIBL of the transistor.

It is still another object of the invention to provide a short channel transistor fabrication method for a semiconductor device, which can save manufacturing cost by omitting additional processes for overcoming SCE and DIBL of the transistor from the conventional transistor fabrication method for the semiconductor device.

According to an aspect of the invention for realizing the above objects, a short channel transistor fabrication method for a semiconductor device comprises the following steps of: sequentially forming a first oxide film, a first nitride film, a second oxide film and a second nitride film on a semiconductor substrate; forming a first mask in a proper configuration on the second nitride film; etching the second nitride film and the second oxide film using the first mask; removing the first mask; forming a first spacer film on the resultant structure and etching an entire surface of the first spacer film to form a first spacer at lateral portions of remaining portions of the second oxide and nitride films, wherein the first oxide film is etched using the first spacer as a mask; sequentially forming a gate insulation film and a gate conductor on an exposed portion of the semiconductor substrate and then performing CMP using the remaining second nitride film as a CMP stop layer to form a gate conductor; wet etching the remaining second nitride film, second oxide film, first nitride film and first spacer; performing LDD implantation on an entire surface of the substrate using the gate conductor as a mask to form an LDD region; forming a second spacer film on an entire surface of the substrate including the LDD region and then etching an entire surface of the second spacer film to form a second spacer at a lateral portion of the gate conductor; performing source/drain implantation on an entire surface of the substrate using the gate conductor including the second spacer as a mask to form source/drain regions; removing the remaining first oxide film; and forming a salicide region in the gate conductor and the source/drain regions.

It is preferred that the first spacer film is made of nitride.

It is preferred that the first spacer film is adjusted in width to adjust the size of a channel.

It is preferred that the second spacer film is made of oxide or nitride.

Also, it is preferred that the gate conductor is made of polysilicon or metal.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

The following detailed description will present a preferred embodiment of the invention in reference to the accompanying drawings.

FIGS. 2A to 2D are sectional views illustrating a short channel transistor fabrication method for a semiconductor device of the invention.

Figure 1:
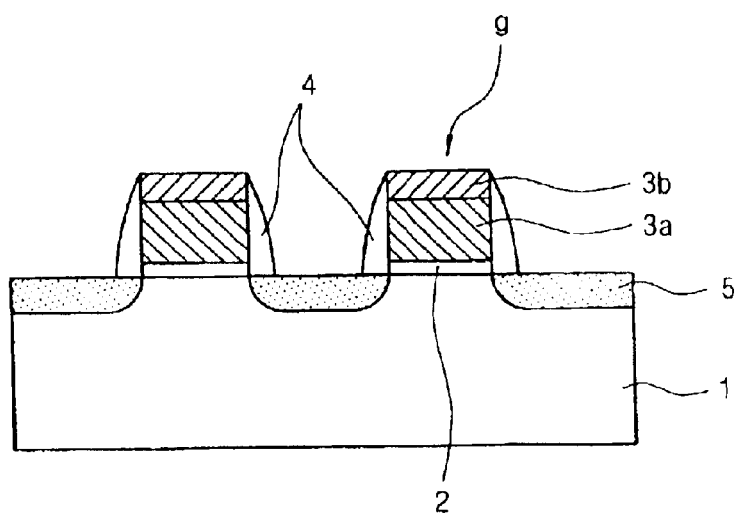
FIG. 1 is a sectional view illustrating a transistor fabrication method for a semiconductor device of the prior art.
Figure 2A:
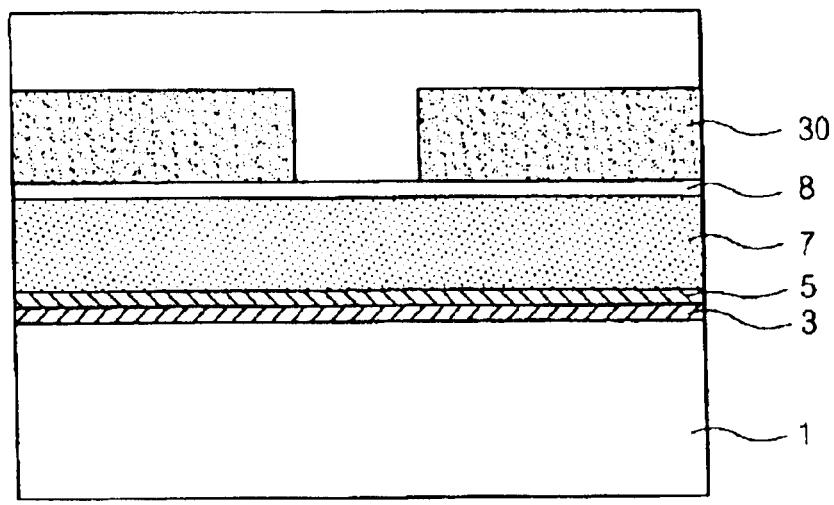
FIGS. 2A to 2D are sectional views illustrating a short channel transistor fabrication method for a semiconductor device of the invention.

Referring to FIG. 2A, a first oxide film 3, a first nitride film 5, a second oxide film 7 and a second nitride film 8 are sequentially deposited on a semiconductor substrate 1. Using a photosensitive film, a first mask 30 is formed in a proper configuration on the second nitride film 8.

Figure 2B:
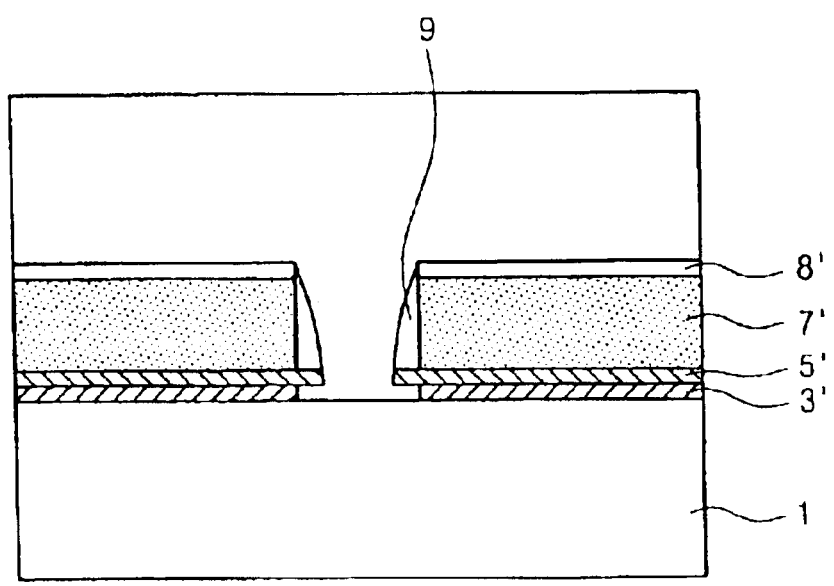

Referring to FIG. 2B, the second nitride film 8 and the second oxide film 7 are sequentially dry-etched using the first mask 30. The reference number 8' indicates a portion of the second nitirde film remaining after the dry-etching, and the reference number 7' indicates a portion of the second oxide film remaining after the dry-etching.

The first mask is removed, a first spacer film is deposited on the entire substrate including the remaining second nitride and oxide films 8' and 7', and then the entire first spacer film is etched to form a first spacer 9. The first spacer film is made of a nitride film. In the etching for forming the first spacer 9, the first nitride film 5 is etched using the first spacer film as a mask. The reference number 5' indicates a portion of the first nitride film remaining after the etching.

The first oxide film 3 is wet-etched. The reference number 3' indicates a portion of the first oxide film remaining after wet etching.

A gate insulation film 11 and a gate conductive layer are sequentially deposited on an exposed portion of the semiconductor substrate 1 in FIG. 2B. Using a remaining portion of the second nitride film 8' as a stop layer, Chemical Mechanical Polishing (CMP) is performed, thereby forming a gate conductor 13.

Then wet etching is performed to sequentially remove the second nitride film 8', the first spacer 9, the second oxide film 7' and the first nitride film 5'.

Next, implantation is performed to form a Low Doped Drain (LDD) implant region 15. After depositing a second spacer film on the entire surface of the resultant structure, the second spacer film is etched forming a second spacer 17 at a lateral portion of the gate conductor 13, in which the second spacer film is made of oxide or nitride.

Figure 2C:
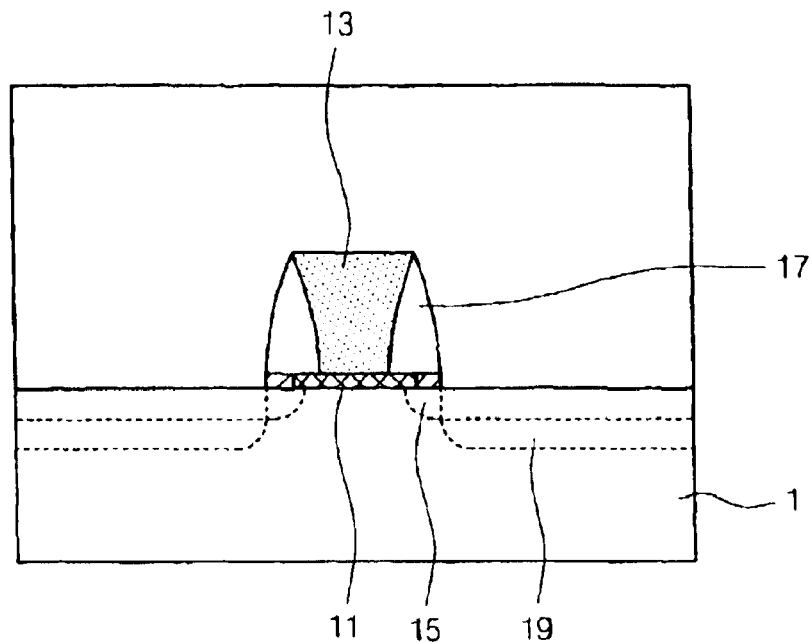

Source/drain implantation is performed using the gate conductor 13 including the second spacer 17 as a mask so as to form source and drain regions 19, and then the remaining first oxide film 3' is removed via wet etching to form a structure shown in FIG. 2C.

Figure 2D:
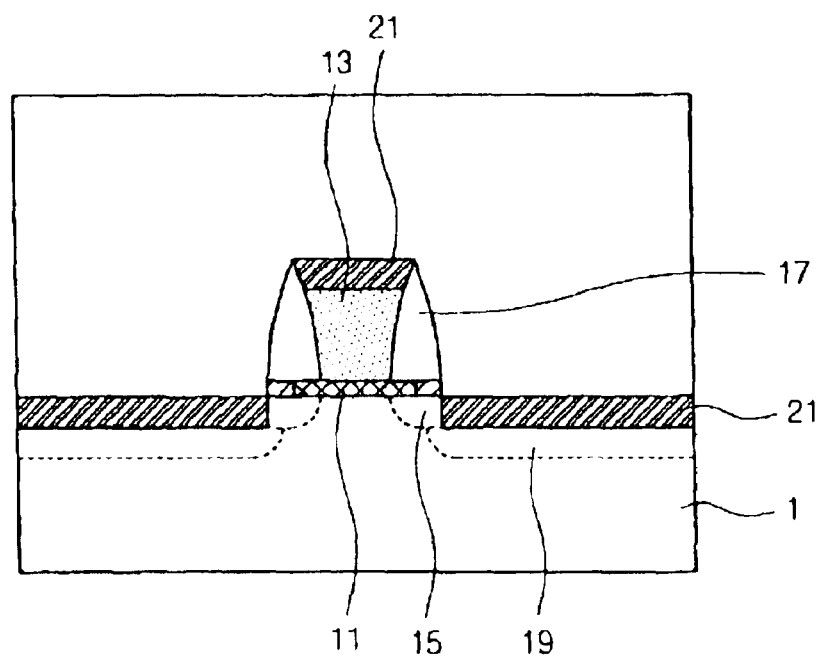

Referring to FIG. 2D, a salicide region 21 is formed in the gate conductor 13 and the source/drain regions 19.

According to the short channel transistor fabrication method for a semiconductor device of the invention as set forth above, a short channel transistor adequate for an ultrafine device can be fabricated via a spacer.

The LDD implant region owing to the above spacer can be formed distant from a channel region of the transistor so as to reduce SCE and DIBL of the transistor thereby improving qualities of the transistor.

Also, the short channel transistor fabrication method of the invention can save manufacturing cost by omitting additional processes for overcoming SCE and DIBL of the transistor from the conventional transistor fabrication method for the semiconductor device.

Furthermore, the short channel transistor fabrication method of the invention can relieve the semiconductor device from the influence of following thermal budget, thereby improving reliability characteristics and enhancing the productivity of the semiconductor device.

The foregoing preferred embodiment of the present invention has been disclosed for illustrative purposes ant it will be apparent to those skilled in the art that various modifications and variations can be made without departing from the scope of the invention which will be defined by the appended claims and equivalents thereof.

What is claimed is:

1. A short channel transistor fabrication method for a semiconductor device, the method comprising the steps of:

sequentially forming a first oxide film, a first nitride film, a second oxide film and a second nitride film on a semiconductor substrate;

forming a first mask in a proper configuration on the second nitride film;

etching the second nitride film and the second oxide film using the first mask;

removing the first mask;

forming a first spacer film on a resultant structure and etching an entire surface of the first spacer film to form a first spacer at lateral portions of remaining portions of the second oxide and nitride films, wherein the first oxide film is etched using the first spacer as a mask;

sequentially forming a gate insulation film and a gate conductor on an exposed portion of the semiconductor substrate and then performing CMP using the remaining second nitride film as a CMP stop layer to form a gate conductor;

wet etching the remaining second nitride film, second oxide film, first nitride film and first spacer;

performing LDD implantation on an entire surface of the substrate using the gate conductor as a mask to form an LDD region;

forming a second spacer film on an entire surface of the substrate including the LDD region and then etching an entire surface of the second spacer film to form a second spacer at a lateral portion of the gate conductor;

performing source/drain implantation on an entire surface of the substrate using the gate conductor including the second spacer as a mask to form source/drain regions;

removing the remaining first oxide film; and forming a salicide region in the gate conductor and the source/drain regions.

2. A short channel transistor fabrication method for a semiconductor device in accordance with claim 1, wherein the first spacer film is made of nitride.

3. A short channel transistor fabrication method for a semiconductor device in accordance with claim 1, wherein the first spacer film is adjusted in width to adjust the size of a channel.

4. A short channel transistor fabrication method for a semiconductor device in accordance with claim 1, wherein the second spacer film is made of oxide.

5. A short channel transistor fabrication method for a semiconductor device in accordance with claim 1, wherein the second spacer film is made of nitride.

6. A short channel transistor fabrication method for a semiconductor device in accordance with claim 1, wherein the gate conductor is made of polysilicon.

7. A short channel transistor fabrication method for a semiconductor device in accordance with claim 1, wherein the gate conductor is made of metal.

* * * * *